United States Patent
Bolken et al.

(10) Patent No.: US 6,417,018 B1
(45) Date of Patent: *Jul. 9, 2002

(54) ASYMMETRICAL MOLDING METHOD FOR MULTIPLE PART MATRIXES

(75) Inventors: Todd O. Bolken, Meridian; Mark S. Johnson, Boise, both of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/724,470

(22) Filed: Nov. 28, 2000

Related U.S. Application Data

(60) Division of application No. 09/385,981, filed on Aug. 30, 1999, now Pat. No. 6,284,825, which is a continuation-in-part of application No. 09/255,554, filed on Feb. 22, 1999, now Pat. No. 6,143,581.

(51) Int. Cl.[7] .............................................. H01L 21/00
(52) U.S. Cl. ........................... 438/26; 438/22; 438/106; 438/124; 438/127
(58) Field of Search ........................... 438/106, 26, 22, 438/124, 127

(56) References Cited

U.S. PATENT DOCUMENTS 6,143,581 A * 11/2000 Johnson et al.

* cited by examiner

Primary Examiner—Kevin M. Picardat
Assistant Examiner—D. M. Collins
(74) Attorney, Agent, or Firm—Workman, Nydegger & Seeley

(57) ABSTRACT

The present invention relates to a method of encapsulating a plurality of chip and board pre-assemblies. Each pre-assembly has first and second surfaces. The method includes positioning a first mold half in a sealing relationship with each first surface of the pre-assemblies and positioning a second mold half adjacent each second surface of the pre-assemblies. The first mold half is filled first thereby forcing each second surface of the pre-assemblies into a sealing engagement with the second mold half. The second molding section is then filled, to result in an asymmetrically overmolded chip and board assembly.

23 Claims, 17 Drawing Sheets

ASYMMETRICAL MOLDING METHOD FOR MULTIPLE PART MATRIXES

RELATED APPLICATIONS

This is a divisional application of U.S. Patent Application Ser. No. 09/385,981, filed on Aug. 30, 1999, now U.S. Pat. No. 6,294,825, which is a continuation-in-part of U.S. Patent Application Ser. No. 09/255,554, filed on Feb. 22, 1999, now U.S. Pat. No. 6,143,581 (hereinafter the "Parent Application"), both of which are incorporated herein by reference.

BACKGROUND OF THE INVENTION

1. The Field of the Invention

The present invention relates to a method of electrical packaging devices. More particularly, the present invention relates to transfer molding of microelectronic devices using asymmetric encapsulation. In particular, the present invention relates to asymmetrically molding a plurality of chip-and-board pre-assemblies by arranging them into a multiple-part matrix.

2. The Relevant Technology

In the packaging of semiconductor chip assemblies, it has been found desirable to place encapsulation material in and around elements of the semiconductor chip. Encapsulation material helps to reduce and redistribute strain, stress, and damage between the semiconductor chip and the connections made therefrom. It also reduces strain, stress, and damage between the chip and supporting substrates such as printed circuit boards. Additionally, the encapsulation material seals the components against the elements as well as facilitates continued electrical contact between the semiconductor chip and the printed circuit board. Additionally, the encapsulation material may hold the entire semiconductor chip package together.

It is also preferred through packaging of semiconductor chips to be able to handle the chip package under commercial assembly conditions such as simultaneously-produced packages without causing damage thereto. However, if a semiconductor chip package assembly needs to be self-packaged, care must be taken during encapsulation to ensure that placement of the encapsulation material does not compromise the integrity of the terminals on the substrate such as a ball array and the like. In particular, it is important to avoid contacting the terminals on the substrate with the encapsulation material.

In the chip packaging field, miniaturization includes the process of crowding an increasing number of microelectronic circuits onto a single chip and simultaneously reducing the overall chip package size so as to achieve smaller and more compact devices. Examples of such devices include hand-held computers, personal data assistants, portable telecommunication devices and the like. Ideally, the size of the chip will continue to be miniaturized and the chip package size will continue to shrink until the chip package will be no larger than the chip itself.

As the overall chip package is subject to miniaturization, ball arrays have been reduced to less than 1 mm pitch. Miniaturization has the counterproductive effect upon chip packaging of an increased heat load per unit chip volume because of a denser electronic activity. This increased heat load must be borne by a smaller chip package structure. Miniaturization also has the counterproductive effect of increased thermal stresses upon the chip package due to increased thermal loads that lead to warping and bowing of both chip and board, and circuit failure due to thermally stressed and broken electrical connections between chip and board.

Where a chip package is to be overmolded with an encapsulation material, overmolding of the chip package on both surfaces of a printed circuit board, also referred to as a substrate, previously required that the overmolded substrate have substantially the same projected area of mold material disposed upon each side thereof. The requirement of substantially the same projected area of mold material disposed upon each side of the substrate was due to the fact that mold cavities were symmetrical. Symmetrical mold cavities were required for many reasons. One reason was because of the viscosity inherent in encapsulation material during the overmolding process and the high degree of pressure that was required to hold a mold together at its seams in order to prevent encapsulation material from leaking between the mold seams and contaminating electrical contacts such as ball arrays.

Where chip packaging is preferably a high-volume process, the simultaneous overmolding of a chip on board package could not previously be done in a single molding operation due to the limiting nature of symmetrical mold cavities. In a symmetrical mold cavity using the transfer-molding method, the encapsulation material, typically a thermoplastic or a thermosetting material, enters into the mold cavity and flows over the integrated circuit chip. Flow also covers the electrical leads that are exposed within the mold cavity. The encapsulation material is then cured to harden it. Traditionally, it has been necessary to control the flow of the encapsulation material into the cavity for a number of reasons. Initially, a void-free fill over the integrated circuit chip was necessary so as to prevent exposure and contamination of the integrated circuit chip during subsequent handling and field use. Additionally, thermosetting fill material needed to be flowing into the mold cavity under conditions so as not to displace any material such as bond wires.

As the size of the chip package continues to shrink, the available real estate on the printed circuit board for making electrical connection to the chip comes at an increasing premium. Thus, methods of wiring chips to the board must be found to accommodate the shrinking amount of printed circuit board real estate.

There is therefore a need for an improved encapsulation method for transfer molding of electronic devices wherein an asymmetric overmolded design is achieved in a single molding operation where the encapsulation procedure is simultaneously performed on a multiple-part matrix of electrical device and substrate pre-assemblies simultaneously. Such multiple-part matrixes, asymmetrical molding apparatuses, and methods are disclosed and claimed herein.

SUMMARY OF THE INVENTION

The present invention relates to a multiple-part matrix asymmetrical mold tooling and a method of using it. The tooling is designed for simultaneous asymmetrical molding of a plurality of chip and board pre-assemblies. The tooling includes a first mold half. The first mold half has a plurality of unisolated depressions therein. Each unisolated depression is in flow communication with at least one other unisolated depression through either a runner channel or a header channel. The unisolated depressions are thus connected either in series, in parallel, or both.

The multiple-part matrix mold tooling further comprises a second mold half that matches the first mold half with a plurality of isolated depressions that correspond to the first mold half plurality of unisolated depressions. Each second mold half isolated depression is smaller in volume than its corresponding first mold half unisolated depression.

In one embodiment of the present invention, a first unisolated depression in the first mold half is in flow communication with a header channel and a runner channel on one edge thereof and with a runner channel on a second edge thereof. The header channel may be in flow communication with at least three first unisolated depressions or a greater number such as six. Where the header channel is in flow communication with more than three first unisolated depressions, it is preferable the plurality of first unisolated depressions is disposed on opposite sides of the header channel.

In one embodiment, a plurality of header channels is configured in flow communication with a plunger site. In this embodiment of the present invention, the plurality of first unisolated depressions may be supplied through a corresponding plurality of runners.

In accordance with a method embodiment of the present invention, the method includes forming at least one substrate having a plurality of package sites. To the plurality of package sites are attached a plurality of electrical devices to form a plurality of pre-assemblies Each pre-assembly has a first surface and a second surface. The pre-assemblies are set into the inventive multiple-part matrix mold tooling. A first amount of encapsulation material is positioned on the first surface by transfer molding. The encapsulation material continues to flow through a plurality of gates, one gate for each pre-assembly, that is formed between slots in the substrate and one edge of the electrical devices to form second smaller area amounts of encapsulation material that are positioned on the second surface thereby.

According to the inventive method, positioning the first amount of encapsulation material on the first surface by transfer molding, results in a seal that forms against encapsulation material between the second surface and the second mold half. The seal against encapsulation material may also be accomplished or facilitated by applying external force to the second mold half.

The inventive method and mold result in a leading first mold section and a trailing first mold section in relation to flow of encapsulation material between unisolated depressions in the first mold half. The leading first mold section and the trailing first mold section are in flow communication by a runner disposed therebetween. Encapsulation material flows through a primary gate into the leading first mold section and then through a primary gate into the trailing first mold section. Encapsulation then flows into isolated depressions such as a leading and a trailing second mold section in the second mold half through secondary gates from respective leading and trailing first mold sections in the first mold half.

The present invention provides several advantages over prior art techniques. The method of the present invention may be carried out using existing processes and materials having well known and understood properties. With the inventive multiple-part matrix asymmetrical mold tooling, assembly throughput is increased. These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
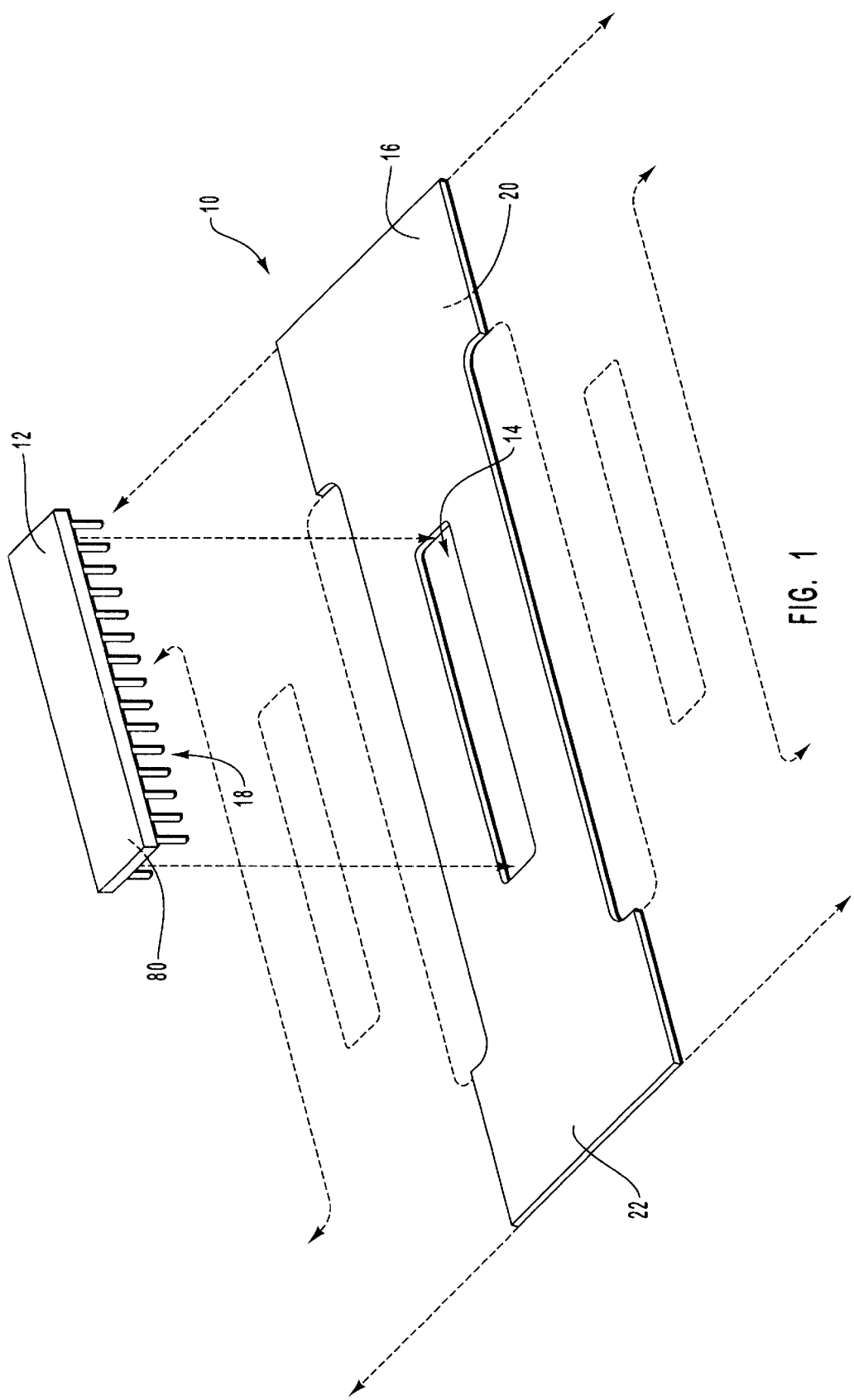
FIG. 1 is an exploded perspective view of an integrated circuit chip being inserted into a substrate such as a printed circuit board.

The present invention relates to asymmetrically molding a plurality of chip packages by arranging them into a multiple-part matrix of electrical device and substrate pre-assemblies. The miniaturization-hindering technology of symmetrical mold structures is overcome with the advent of asymmetrical molding as disclosed in the Parent Application.

In the present invention, a single molding step achieves an asymmetrical molding of a plurality of integrated circuit chips and corresponding plurality of printed circuit boards where the chip and board pre-assemblies are arranged and simultaneously overmolded in a multiple-part matrix mold tooling. The single molding step can overmold both sides of a printed circuit board and chip pre-assembly, asymmetrically in relation to encapsulation material flow, and in relation to overmolded areas on each surface of the pre-assembly. Typically this asymmetrical molding technique may encapsulate a chip on board package (COB) or a board on chip (BOC) package by having a mold cavity that has a larger area on one surface thereof than on the other surface thereof. Further, injection of the encapsulation material is carried out by filling the larger area mold cavity half first. By filling the larger area mold cavity half first, encapsulation material in the larger area mold cavity half applies pressure to the second, and smaller area mold cavity half under conditions sufficient to cause a sealing engagement between the substrate and the second and smaller area mold cavity half Alternatively, the filled first mold cavity half provides resistance points to external pressure that may be applied from the portion of the mold that forms the second mold cavity half.

Because the encapsulation material moves in a plug flow regime over the integrated circuit chip on only one surface of the chip and board pre-assemblies at a time, secondary gates are provided. In other words, a portal is formed between the slot in the printed circuit board and the integrated circuit chip at the end of the integrated circuit chip that is opposite the initial flow of encapsulation material into the mold cavity. As the encapsulation material flows through the secondary gate, it reverses flow direction and encapsulates the wiring between chip and board. In other words, upon reaching the secondary gate, the encapsulation material flows through the secondary gate and within the slot in the printed circuit board, flows across the bond wires in the second and smaller area mold cavity half in a direction opposite to flow over the integrated circuit chip in the first and larger mold cavity half.

Because of the pressure against the printed circuit board from the larger area mold cavity, the printed circuit board is effectively sealed against the smaller area mold cavity and the likelihood of the encapsulation material leaking out of the second mold cavity onto the ball array or other electrical connections is substantially reduced.

Although the discovery of asymmetrical molding allows for an overmolded integrated circuit chip package to have different amounts of encapsulation material upon opposite surfaces of the printed circuit board and chip pre-assembly, there remains the need for mass production of integrated circuit chip packages made by the inventive asymmetrical molding method. Consequently, it was discovered that asymmetrical molding could be carried out by configuring a plurality of chip and board pre-assemblies in a multiple-part matrix and simultaneously overmolding them.

With the ever-increasing pressure on the fabricator of chip packages to miniaturize, board on chip (BOC) technology has been developed that allows the ball array to be disposed on one side of the printed circuit board or other substrate, and the semiconductor chip to be disposed on the other side. With BOC technology, the size of the integrated circuit chip is significantly large compared to the singulated printed circuit board. Consequently, in order to further miniaturize, the ball array necessarily is at least in part directly opposite the integrated circuit chip, where the chip is mounted on the opposite side of the printed circuit board as the ball array. As a consequence of the printed circuit board being in between the ball array and the chip, where the ball array is aligned exactly opposite the chip, overmolding of the integrated circuit chip became impossible under prior art technology. Where the integrated circuit chip is disposed on one side of the printed circuit board, and the wire bonds that connect the integrated circuit chip to the ball array is disposed on the other side of the printed circuit board, symmetrical molding could not be done because of the symmetrical mold cavity that required equal sized areas of encapsulation material on each side of the printed circuit board.

Reference will now be made to figures wherein like structures will be provided with like reference designations. It is to be understood that the drawings are diagrammatic and schematic representations of embodiments of the present invention and are not limiting of the present invention nor are they necessarily drawn to scale.

Description of Single-Chip Overmolding

FIG. 1 illustrates a substrate 10 such as a printed circuit board which may be used in conjunction with the present invention. Connections 18 such as bond wires originate along a major axis of an electrical device 12 such as an integrated circuit chip and extend from the center of an electrical device 12. Device 12 is positioned over an opening 14 such as a slot, upon a first side 16, which may be referred to as the chip side 16, such that electrical connections 18 of device 12 extend through opening 14 to a second side 20, which may be referred to as the ball side 20. An active surface 80 of device 12 is facing downward toward first side 16 of substrate 10.

Figure 2:
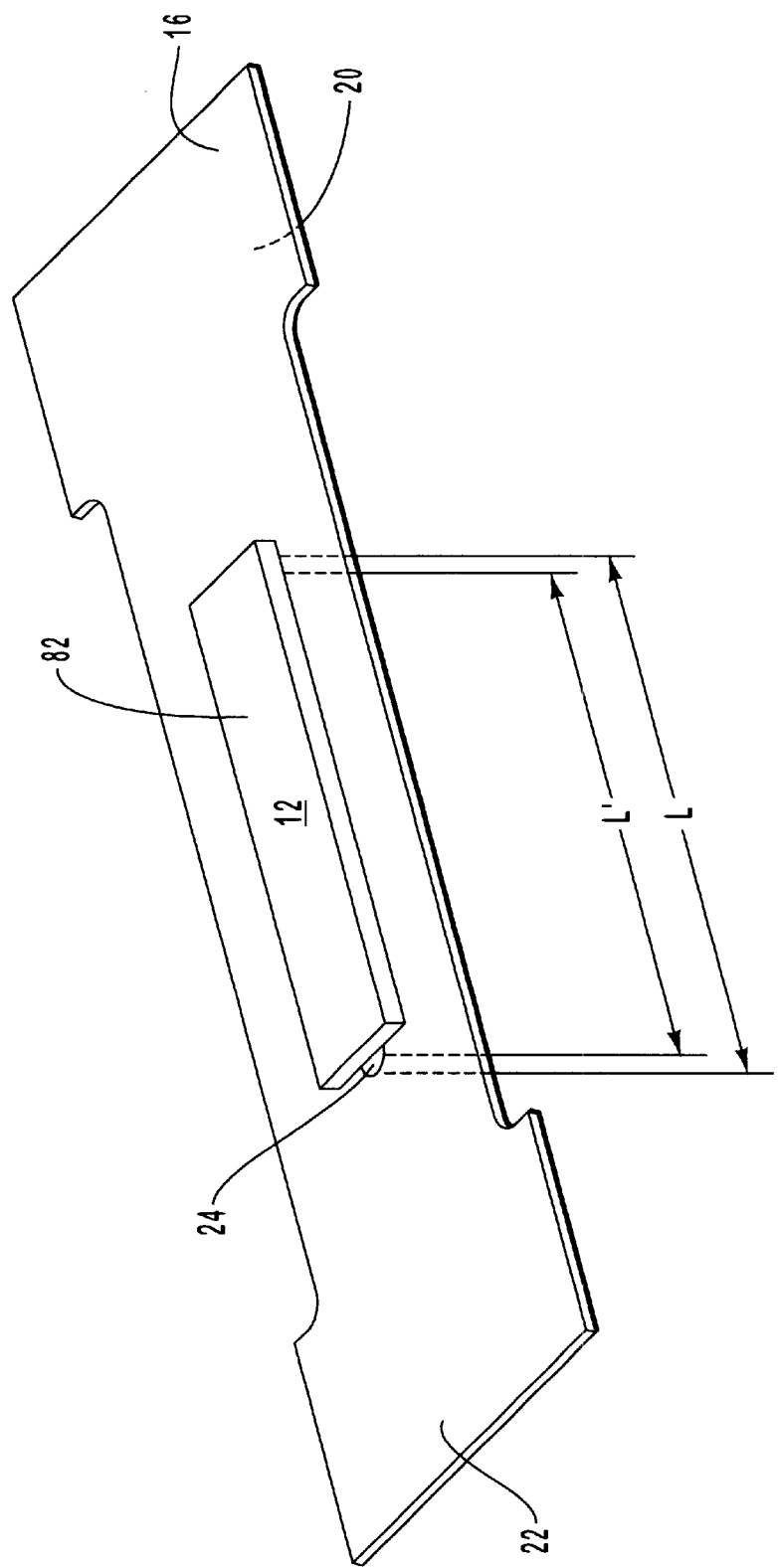
FIG. 2 is a perspective view of a pre-assembly according to the present invention, wherein a secondary gate allows for mold material to flow from the first side of the substrate to a second side thereof.

In the remaining figures of this section, only a portion 22 of substrate 10 is depicted for illustrative purposes of describing the inventive asymmetrical overmolding. FIG. 2 illustrates that device 12 is positioned such that opening 14 is not completely blocked thereby. A small window referred to as a secondary gate 24 exists where the first length, L, of opening 14 is greater than the second length L', of device 12. Thereby, encapsulation material will be allowed to flow in a first direction across a board and chip surface that includes first side 16, to overmold device 12 on its inactive surface 82. Encapsulation material continues to flow through secondary gate 24, and to flow across a board and chip second surface of the pre-assembly that includes second side 20. Flow is in the opposite direction as the first flow direction. If device 12 completely blocks opening 14, an alternate means of providing encapsulation material may be provided as described below.

Figure 3:
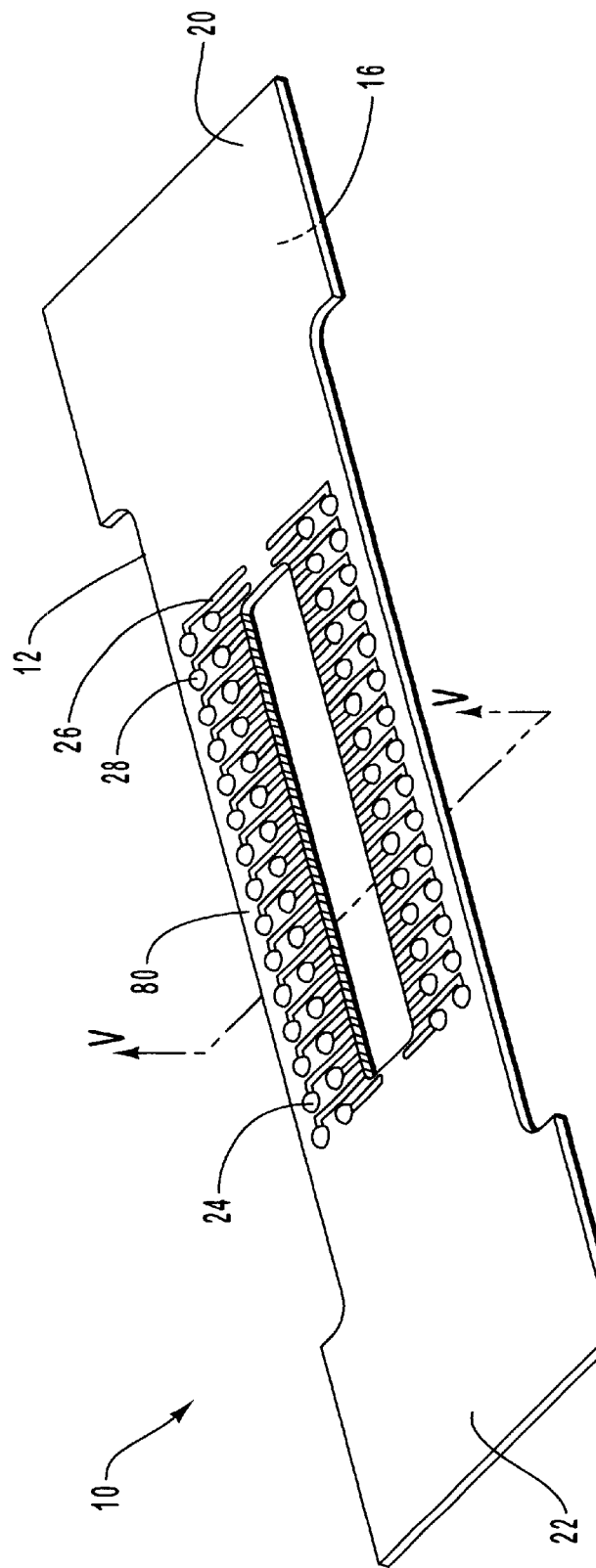
FIG. 3 is a perspective view of the inventive pre-assembly, wherein the secondary gate and the integrated circuit are revealed through a slot in the substrate.

In FIG. 3, the second board and chip pre-assembly surface that includes second side 20 of portion 22 of substrate 10 is illustrated. Second side 20 has traces 26 formed within and upon substrate 10. Traces 26 may be formed using a solder masking step as is known in the art. Solder balls 28 may be disposed upon portion 22 to provide a connection point for each of traces 26. After device 12 is connected to portion 22 and the electrical connections (not pictured) are extended through opening 14, each electrical connection makes electrical contact to one of traces 26 using any known connection technique.

Although the present invention is preferably carried out by transfer overmolding, the inventive asymmetrical overmolding may be done by other methods such as by dispensive encapsulation material writing and the like. It may also be done by encapsulation material spraying and the like. It may also be done by encapsulation material brush or roller painting and the like.

Figure 4:
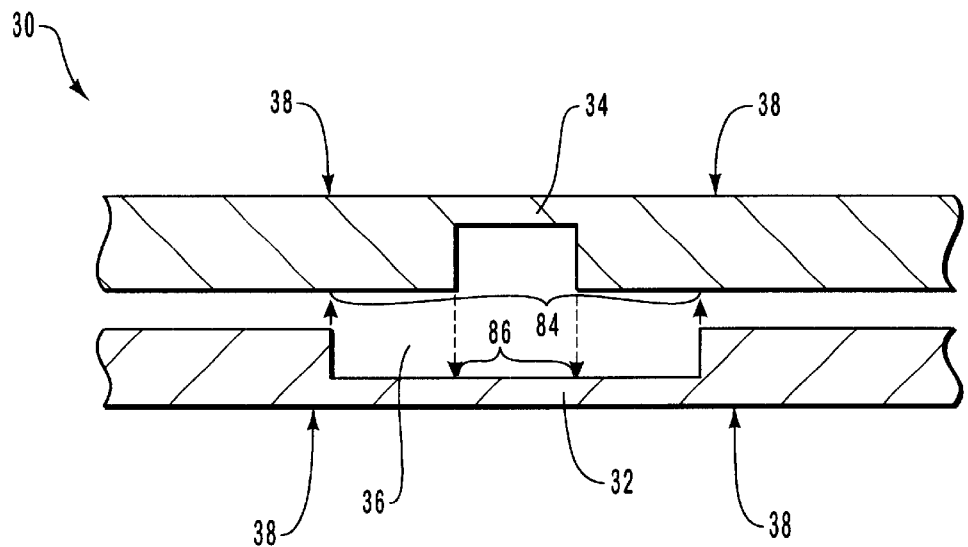
FIG. 4 is an elevational cross-section view of an asymmetrical mold tooling.

A mold 30 which may be used in conjunction with the method of the present invention is illustrated in cross-section in FIG. 4. In FIG. 4, a first mold half 32 and a second mold half 34 cooperate to define a mold cavity 36. The first mold half projected surface area 84 can be seen as the opening width of first mold half 32 projected against second mold half 34. The second mold half projected area 86 can be seen as the opening width of second mold half 34 projected against first mold half 32. It can be seen that projected first mold half surface area 84 is larger than projected second mold half surface area 86 by a factor of about 3. Because the drawing of FIG. 4 is not necessarily to scale, and because the ratio of 3:1 is for illustrative purposes only, it is not meant to be limiting of the present invention. Other ratios may include 2:1, 4:1, and 5:1. The ratio of the first mold half projected surface area 84 to the second mold half projected surface area 86 will depend upon the particular application of this embodiment.

After the insertion of a pre-assembly into mold cavity 36, the projected surface area will remain essentially the same. However, topography of the pre-assembly itself presents a non-planar surface area that is to be overmolded according to the present invention with a selected volume of encapsulation material. In most embodiments of the present invention, it is preferred that the volume that occupies that part of mold cavity 36 in first mold half 32 is greater than the volume of encapsulation material that occupies that part of mold cavity 36 in second mold half 34.

Figure 5:
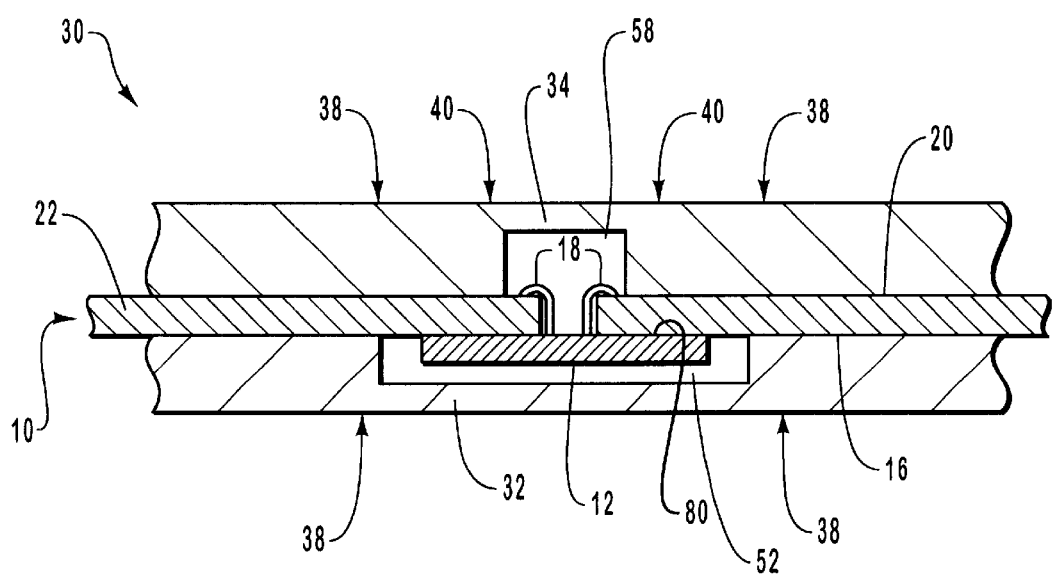
FIG. 5 is an elevational cross-section view of the mold tooling depicted in FIG. 4 with a board-on-chip pre-assembly disposed within the mold cavity.

FIG. 5 illustrates a cross section of a substrate 10 disposed between first half 32 and second half 34 of mold 30. Portion 22, including substrate 10 and device 12 as a pre-assembly, is positioned such that device 12 is entirely within that part of cavity 36 formed by first mold half 32, although, for other devices other configurations may be possible. Similarly, opening 14, and the contact of electrical connections 18 to traces 26 is positioned entirely within that part of cavity 36 formed by second mold half 34.

As a pre-assembly, first side 16 and part of device 12, as exposed within that part of cavity 36 formed by first mold half 32 constitute a first surface to be overmolded. Similarly, second side 20 and a different part of device 12, as exposed within that part of cavity 36 formed by second mold half 34 constitute a second surface to be overmolded.

FIGS. 4 and 5 illustrate the asymmetry between mold sections 32 and 34 to form an asymmetrical mold cavity 36. The differences in surface area of substrate 10 and device 12, in this illustrated embodiment covered by first mold half 32 compared to the surface area substrate 10 and device 12 covered by second mold half 34, may be approximately three times greater although the precise ratio will depend upon the specific application of the present invention. Generally, the surface area of the first side 16 of portion 22 within mold cavity 36 will be greater than the surface area of the second side 20 of portion 22 within mold cavity 36. That is, the surface area of the first side 16 of portion 22 that will be overmolded with encapsulation material, exceeds the surface area of the second side 20 of portion 22 that will be overmolded with encapsulation material.

Another advantage of the asymmetry is that first mold half 32 may be sealed against the first side 16 of portion 22 by applying clamping pressure in the four areas marked 38. No such seal is formed at this time between second mold half 34 and second surface 20 of portion 22 because no clamping pressure is exerted in opposition to the two areas marked 40.

The structure depicted in FIG. 5 is a multiple-part matrix encapsulation tooling system, with focus on a single pre-assembly, that comprises a plurality of n first unisolated depressions 52 located in first mold half 32. The plurality of n first unisolated depressions 52 is connected by runner channels for the fluidic conveyance of encapsulation material. FIG. 5 also illustrates a plurality of n first isolated depressions 58 located in second mold half 34. The plurality of n first isolated depressions 58 is smaller in projected surface area than that of the plurality of n first depressions located in first mold half 32. The part of cavity 36 formed from first mold half 32 is paired with the part of cavity 36 formed from second mold half 34.

Figure 5A:
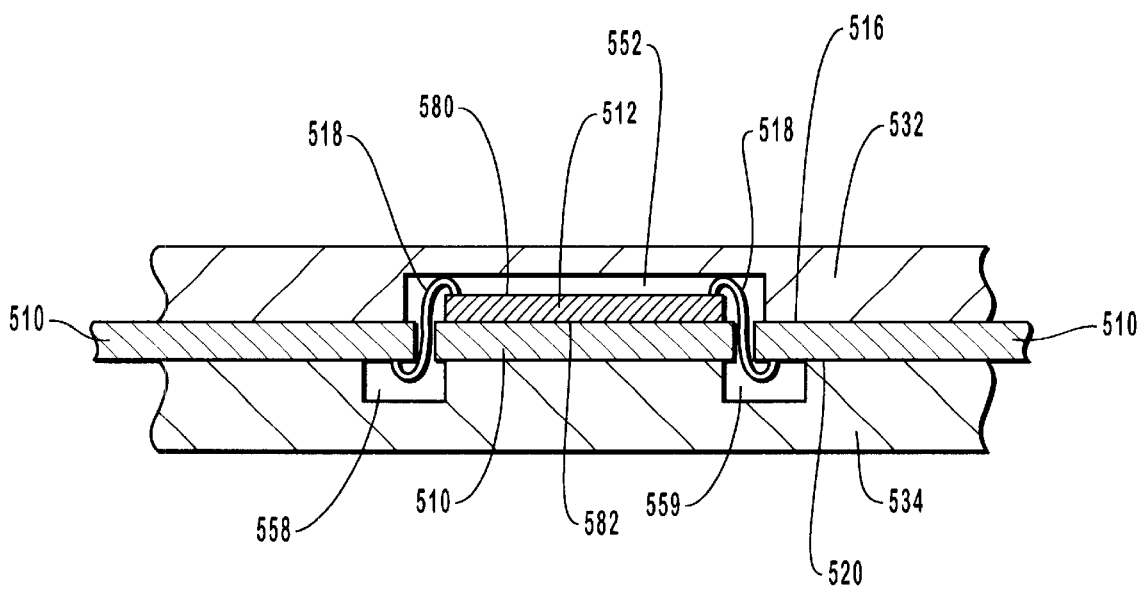
FIG. 5A is an elevational cross-section view of a mold tooling for a chip-on-board pre-assembly wherein bond wires mount through the board.

For chip-on-board technology, as seen in FIG. 5A, the multiple-part matrix encapsulation tooling system, focusing on a single electrical device 512, comprises a plurality of n first unisolated depressions 552 located in a first mold half 532. The n first unisolated depressions 552 are located in a first mold half 532 and they are connected by runner channels (not pictured).

The multiple-part matrix encapsulation tooling system depicted in FIG. 5A also includes a plurality of n first isolated depressions 558 located in a second mold half 534. The plurality of n first isolated depressions 558 is smaller in projected surface area than that of the plurality of n first unisolated depressions 552 located in first mold half 532. The structure depicted in FIG. 5A further comprises a second plurality of n first isolated depressions 559 that are equal in surface area to that of the plurality of n first isolated depressions 558. From FIG. 5A, the second plurality of n first isolated depressions 559 have a one-to-one correspondence projected surface area and volume in number and in volume to the first plurality of n first isolated depressions 558. In chip-on-board technology, bond wires 518 extend through the board 510 and make electrical contact upon second side 520, as illustrated in FIG. 5A.

In one embodiment, the encapsulation material is a thermoset epoxy resin mixture and may be loaded under pressure in a range from about 500 psi to about 2,000 psi. Fill times, when the encapsulation material is a thermoset epoxy resin mixture, are in a range from about three to about 10 seconds or longer. The injection pressure and fill times may be dependent upon the specific encapsulation material that is used, the temperature, and throughput requirements among other parameters.

FIG. 5 illustrates that as the encapsulation material fills the part of mold cavity 36 formed by first mold half 32, the portion 22 of the substrate 10 may bend or flex under pressure $P_2$ exerted by encapsulation material. The bending or flexing may bring the second surface 20 into a sealing engagement with second molding section 34. This sealing engagement provides a seal against encapsulation material so that it cannot flash onto the ball array. Thus, a seal is dynamically formed as that part of mold cavity 36 comprising first mold half 32 is filled.

Alternatively or simultaneously with pressure $P_2$ exerting a sealing engagement pressure from first side 16 against sealing pressure points 40, the presence of encapsulation material within the part of mold cavity 36 formed by first mold half 32 may act as a pressure resistance structure or "kicker" against which sealing pressure points 40 may be pushed to form a sealing engagement between substrate 10 on second side 20 and sealing pressure points 40. Thus, a seal is dynamically formed as the part of mold cavity 36 formed by first mold half 32 is filled and pressure is exerted at sealing pressure points 40. In lower pressure applications, it is anticipated that an external force may be exerted at sealing pressure points 40 in addition to clamping pressure points 38 to cause the sealing of substrate 10 to take place on second side 20 within mold cavity 36.

The encapsulation material may be chosen from a class consisting of epoxies that include thermoset resins and the like. The encapsulation material may also be selected from materials in a class consisting of silicones and the like. Alternatively, the encapsulation material may be chosen from a class consisting of sycar and the like. Alternatively, the encapsulation material may be selected from a class consisting of polyimides and the like. The encapsulation material may also be chosen from a class consisting of polyurethanes and the like.

The encapsulation materials are useful for encapsulating electronic components because they each may have at least one property that is useful to the package. Such properties may include a low moisture permeability, a high mobile ions barrier, and a good UV-VIS and alpha particle protection. They may also include favorable mechanical, electrical and physical properties, as well as a low dielectric constant to reduce the device propagation delay and high thermal conductivity to dissipate heat generated by the devices. The proper choice of encapsulation material can enhance reliability of the device and improve its mechanical and physical properties. An optional curing step may be required, depending upon the choice of encapsulation material, followed by removal of respective first and second mold halves 32, 34.

Figure 6:
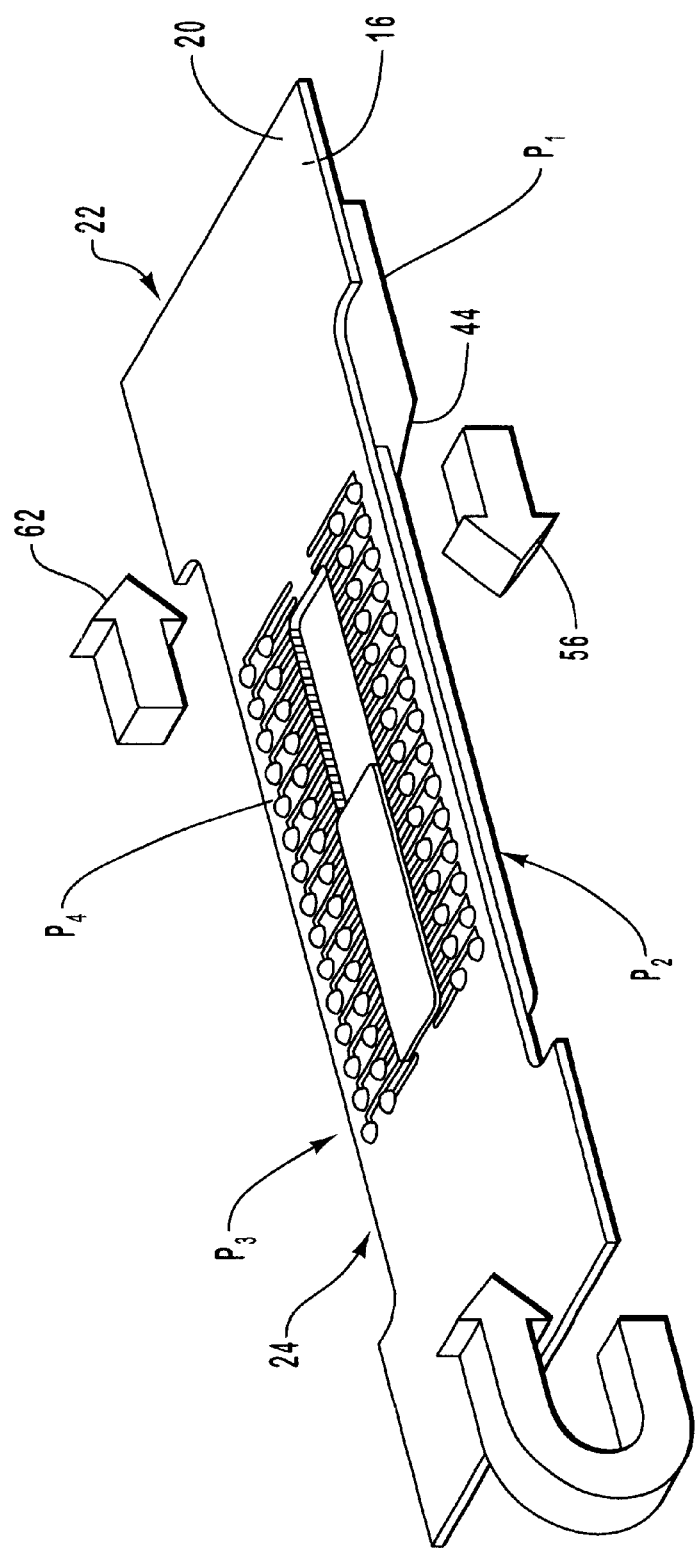
FIG. 6 is a perspective view of the inventive pre-assembly during the asymmetrical molding process to illustrate flow of the encapsulation material.

The asymmetrical and sequential flow of encapsulation material into the mold cavity is illustrated in FIG. 6. Encapsulation material flows under pressure through a runner 42 into the part of the mold cavity formed by the first mold half (not shown). The pressure in runner 42 is designated $P_1$ while the pressure in the part of the mold cavity formed by the first mold half is designated $P_2$. The encapsulation material passes through secondary gate 24 at a pressure of $P_3$ and into the part of the mold cavity formed by the second mold half at a pressure of $P_4$. The pressure is controlled such that $P_1 > P_2 > P_3 > P_4$. An encapsulation material flow front 72 is depicted as moving away from secondary gate 24, in the direction back toward primary gate 44 but upon ball side 20 of substrate 10.

Figure 7:
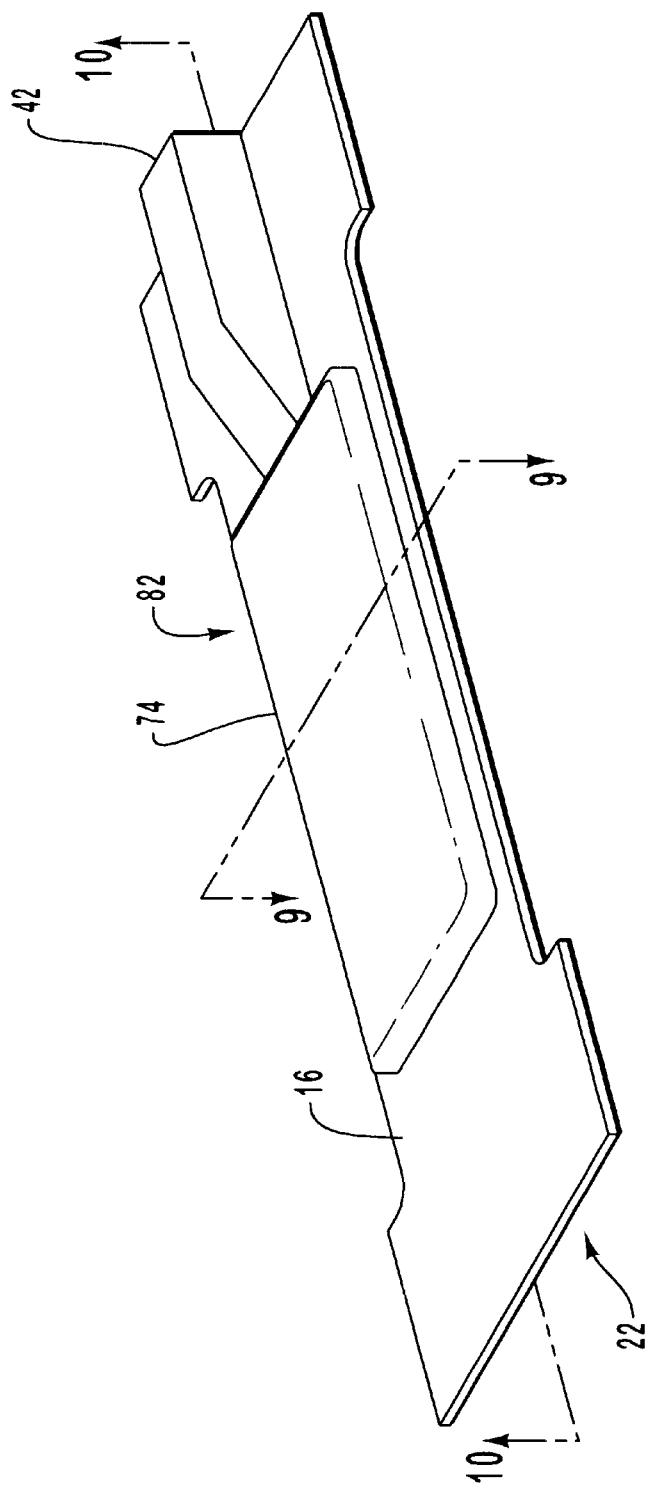
FIG. 7 is a perspective view of the first side of the inventive chip package that has been asymmetrically overmolded.
Figure 8:
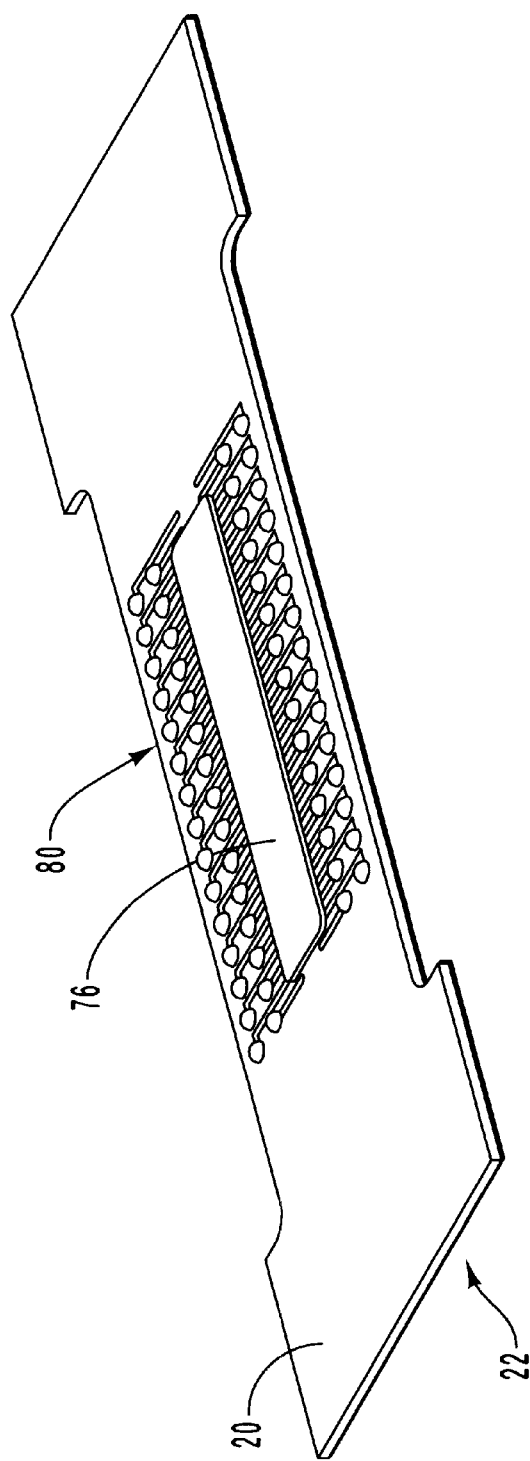
FIG. 8 is a perspective view of the second side of the inventive chip package that has been asymmetrically overmolded.

After respective first and second mold halves 32, 34 are removed, the overmolded chip 12 appears as shown in FIGS. 7 and 8. FIG. 7 shows the first side 16 of portion 22 as an overmolded chip package after removal of the first mold half. A first overmolded section 74 is formed as a result of the encapsulation material being transferred into the part of mold cavity 36 that makes up first mold half 32. Thereby, chip 12 has been overmolded on its inactive surface 82. A runner 42 is depicted as being the supply for encapsulation material.

FIG. 8 shows second side 20 of portion 22 as an overmolded chip package after removal of second mold half 34. A second overmolded section 76 is formed as a result of the encapsulation material being transferred into the part of mold cavity 36 that makes up second mold half 34. Second overmolded section 76 in this embodiment covers the bond wires 18 and thereby, device 12 has also been overmolded on at least a pair of its active surface 80.

Figure 9:
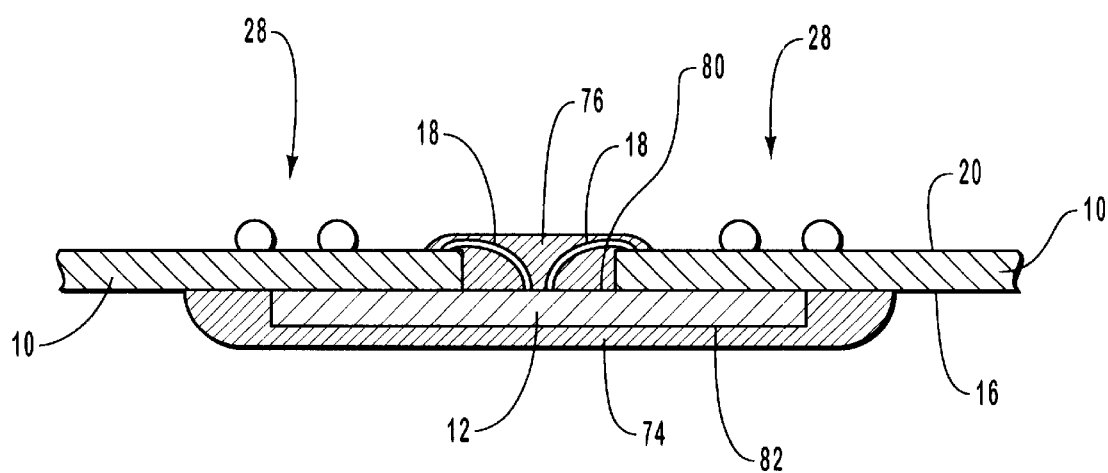
FIG. 9 is an elevational cross-section view as taken from FIG. 7 that illustrates a completed overmolded chip package.
Figure 10:
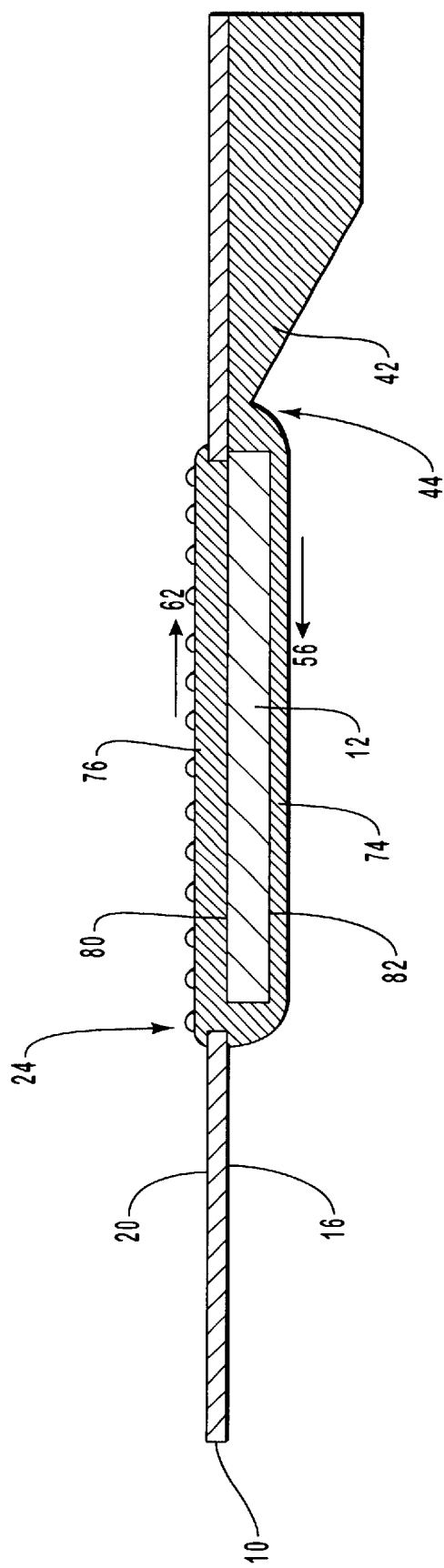
FIG. 10 is an elevational cross-section view as taken from FIG. 7 that illustrates a completed overmolded chip package from a perspective that is at a right angle to the view in FIG. 9.

FIGS. 9 and 10 illustrate views taken along the lines 9—9 and 10—10, respectively, in FIG. 7. FIG. 9 provides a view of chip 12 being enclosed on first side 16 of substrate 10 by first overmolded section 74, and being enclosed from second side 20 of substrate 10 by second overmolded section 76 as well as by part of substrate 10. FIG. 10 provides a view of runner 42 and primary gate 44, which are the mechanism for injecting the encapsulation material into the part of the mold cavity formed by the first mold half. FIG. 10 also provides a view of secondary gate 24. Secondary gate 24 is the portal that, under pressure, directs encapsulation material to flow under pressure $P_2$ from chip side 16 to ball side 20. The flow direction 62 on ball side 20 is the opposite flow direction 56 on chip side 16.

Figure 11:
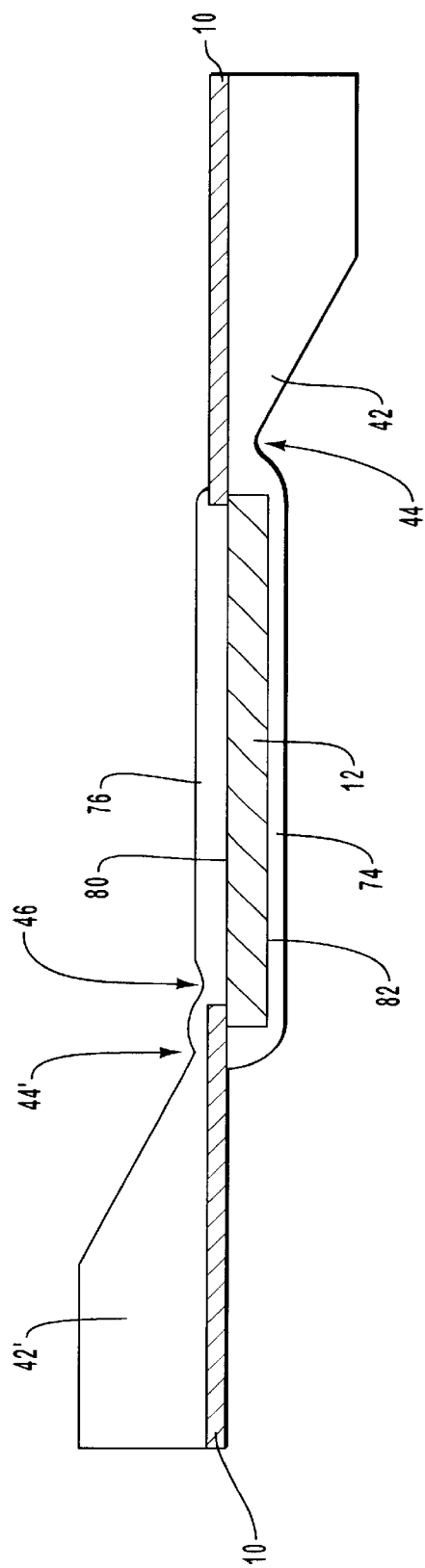
FIG. 11 is an elevational cross-section view of an alternative asymmetrical molding scheme wherein the electrical device and the slot size prevent the formation of a secondary gate.

FIG. 11 shows an alternative gate arrangement that may be used with the method of the present invention. Electrical device 12 to be encapsulated is depicted as a memory chip similar to the one as shown in previous FIGS. 1 through 10, although the electrical device may be any suitable type of device. Device 12 is positioned such that opening 14 (see FIG. 1) is completely blocked. Thus, encapsulation material injected into that part of the mold cavity that is the first mold half from runner 42 and primary gate 44, is contained within the first mold half. That is, there is no secondary gate 24 (see FIG. 2) between the first mold half and the second mold half through which encapsulation material may flow. Encapsulation material may therefore be injected directly into the second mold half through a second side primary gate 44' and a runner 42'. The encapsulation material injected into the second mold half is contained within the second mold half.

Description of Multiple Part Matrix Overmolding

Although the discovery of asymmetrical molding allows for an overmolded integrated circuit chip package to position different surface amounts of encapsulation material upon opposite surfaces of the pre-assembly, there remains the need for mass production of integrated circuit chip packages made by the inventive asymmetrical molding method. Consequently, it was discovered that asymmetrical molding could be carried out by configuring a plurality of chip and board pre-assemblies in a multiple-part matrix and by simultaneously asymmetrically overmolding them.

Figure 12:
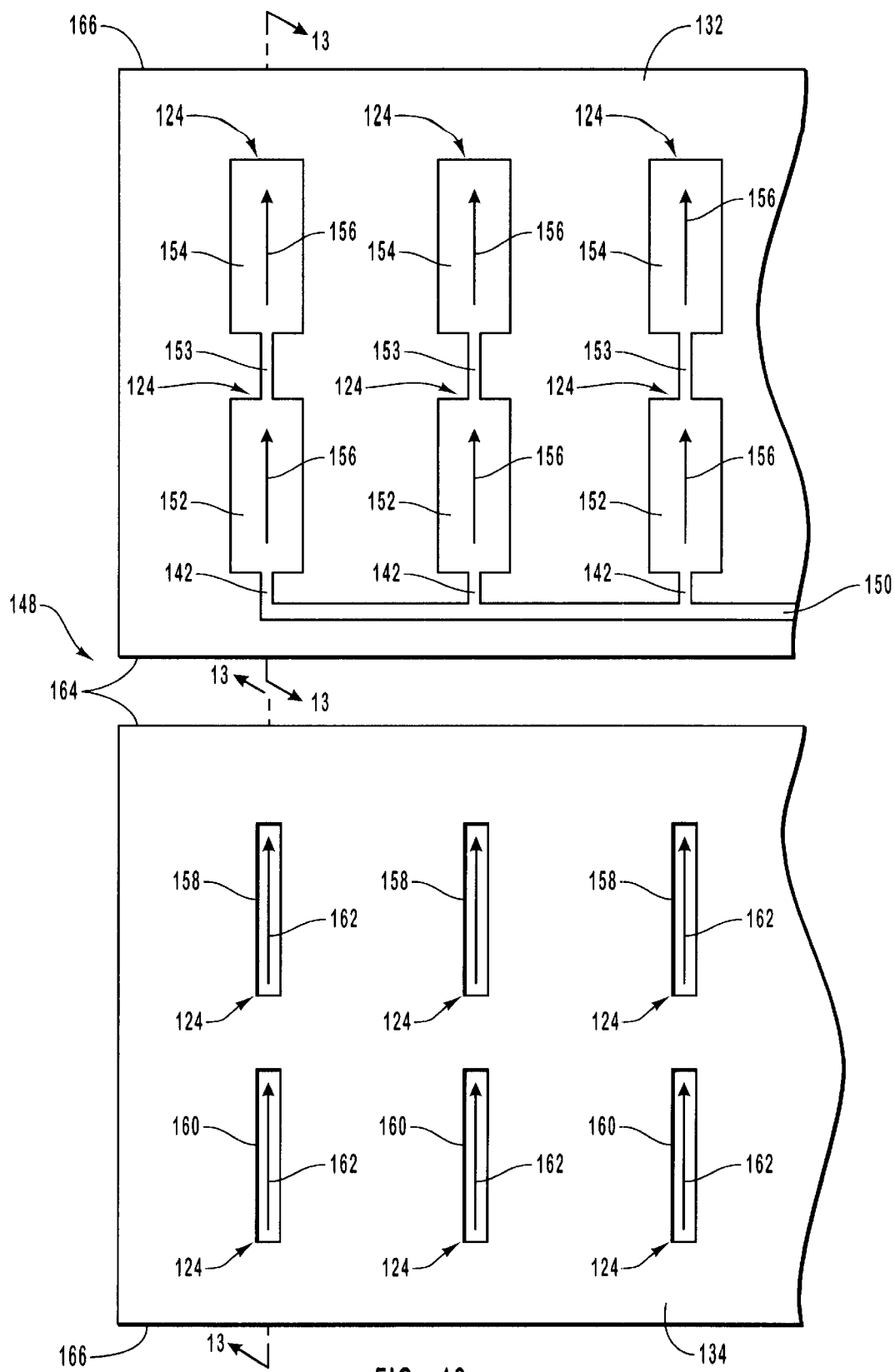
FIG. 12 is a plan view of a multiple-part matrix overmold tooling according to the present invention, wherein the first mold half and the second mold half have been laid open.

FIG. 12 is a plan view of an inventive multiple-part matrix overmold tooling 148 for board-on-chip technology. Multiple-part overmold tooling 148 includes a first mold half 132 with unisolated depressions called first mold sections and a second mold half 134 with isolated depressions called second mold sections. First mold half 132 is illustrated in which a plurality of runners 142 are supplied from a header 150. In FIG. 12, first mold half 132 comprises an in-series set of leading first mold sections 152 and trailing first mold sections 154. As such, asymmetrical overmolding is begun by overmolding the chip sides of pre-assemblies in series between individual sets of leading first mold sections 152 and trailing first mold sections 154. A first flow direction 156 causes encapsulation material to flow from runners 142 in the direction of trailing first mold sections 154. A set of second runners 153 communicate between leading first mold sections 152 and trailing first mold sections 154. Trailing first mold sections 154 also fills with encapsulation material in first flow directions 156. More in-series mold sections than two may be formed in a multiple-part matrix mold tooling. The number may be limited by specific applications, or it may be limited by such parameters as encapsulation material viscosities, tooling press sizes, and other reasons.

In second mold half 134, asymmetrical overmolding is carried out on the second side of the pre-assemblies by filling isolated depressions. In-series overmolding begins from flow at the location of a secondary gate 124 that is created by a portal, for both a leading second mold section 158 and a trailing second mold section 160, similar to a portal made from opening 14 seen in FIG. 2. Upon entry of encapsulation material into second mold half 134, through secondary gate 124, overmolding proceeds by flow in a second flow direction 162 that may be opposite to flow in first flow direction 156.

Figure 13:
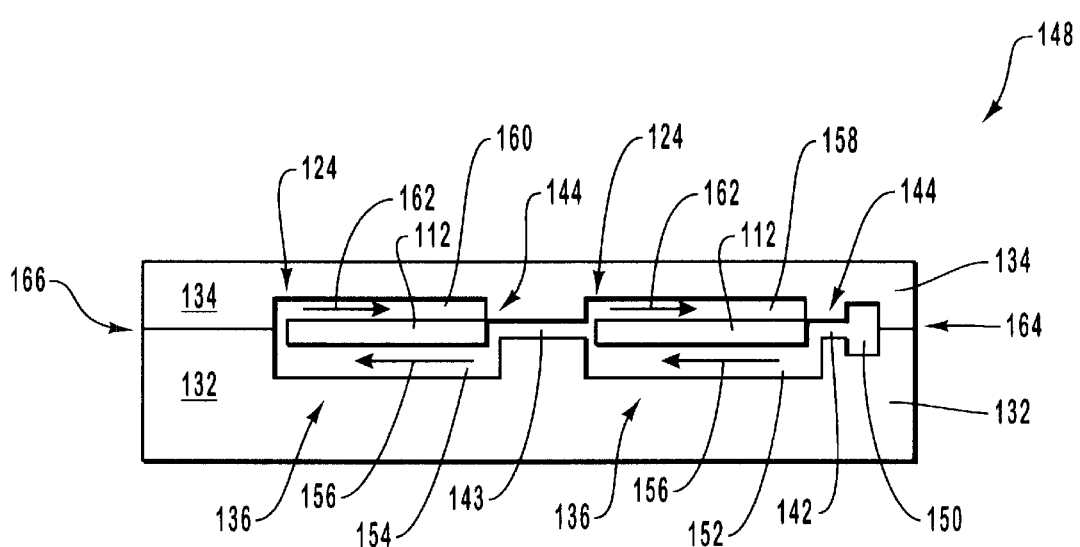
FIG. 13 is an elevational cross-section view of the multiple-part matrix overmold tooling depicted in FIG. 12 after mating the first mold half and the second mold half.

FIG. 13 is a cross-sectional view taken along the section lines 13—13 in FIG. 12 after mating of first mold half 132 and second mold half 134 of multiple-part matrix asymmetrical overmold tooling 148. FIG. 13 illustrates how a substrate is to be laid upon either first mold half 132 or upon second mold half 134 and tooling 148 closed to form cavities 136. For tooling 148, the substrate may be a 2×3 matrix, and preferably larger such as a 2×6, a 2×10, and a 2×12 or other two-by matrixes. The matrix may also be a three-by, such as a 3×3, a 3×6, a 3×9, a 3×12, and a 3×15 or other three-by matrixes. By way of example, where the multiple-part matrix is a 2×3, n is equal to 6.

Electrical devices 112 are enclosed within mold cavities 136. Mating is carried out by aligning first edges 164 and second edges 166 in a stacked relationship. The in-series asymmetrical flow of encapsulation material is illustrated by viewing flow directions of the encapsulation material, beginning at header 150 and along runners 142 toward primary gate 144, into leading first mold section 152 and along first flow direction 156. When the flow of encapsulation material reaches secondary gate 124, it splits and flows in two directions. Trailing first mold section 154 also has a primary gate 144. Thus, encapsulation material may be simultaneously flowing into leading second mold section 158 and into trailing first mold section 154.

Flow cross-sectional area differences between leading second mold section 158 and trailing first mold section 154 may cause flow of encapsulation material to flow more readily into trailing first mold section 154, if it is a larger cross-sectional flow area.

In leading second mold section 158, encapsulation material moving in the second flow direction 162 is reversed compared to first flow direction 156 in leading first mold section 152. In trailing first mold section 154, encapsulation material flows to its secondary gate 124 and the direction of encapsulation material flow reverses from first flow direction 156 in trailing first mold section 154 to second flow direction 162 in trailing second mold section 160.

Figure 14:
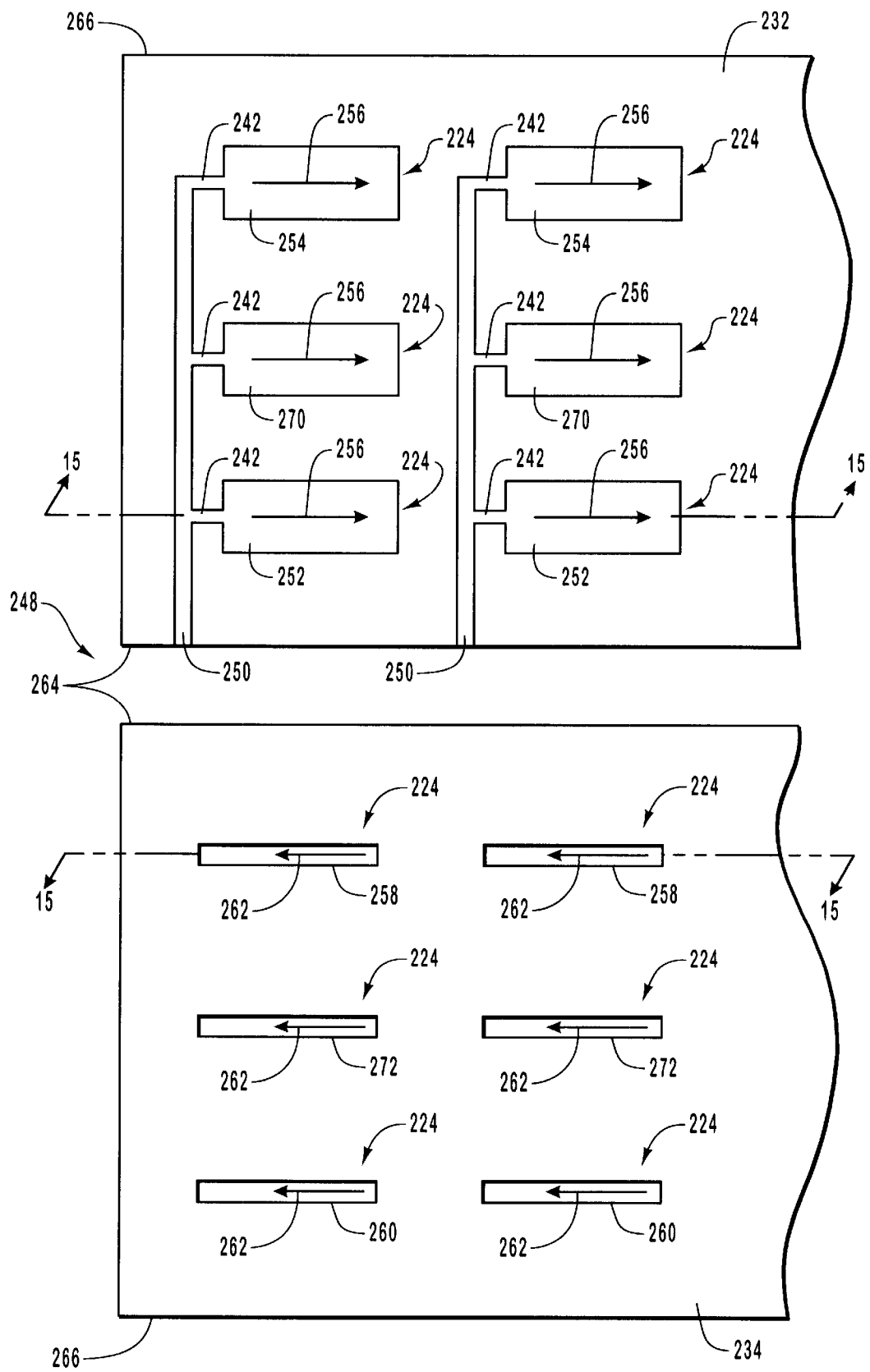
FIG. 14 is a plan view of a laid open multiple-part matrix overmold tooling according to another embodiment of the present invention.

FIG. 14 is a plan view of an inventive multiple-part matrix asymmetrical overmold tooling 248. Multiple-part matrix overmold tooling 248 includes a first mold half 232 and a second mold half 234. First mold half 232 is illustrated in which a plurality of runners 242 are supplied from headers 250. A plunger (not pictured) or an equivalent positive displacement device supplies headers 250. In FIG. 14, first mold half 232 comprises an in-parallel set of un isolated depressions called leading first mold sections 252, middle first mold sections 270, and trailing first mold sections 254. As such, asymmetrical overmolding is carried out on pre-assemblies in parallel between individual sets of leading first mold sections 252, middle first mold sections, 270, and trailing first mold sections 254. A first flow direction 256 causes encapsulation material to flow through header channels 250 and into runners 242 in the direction of trailing first mold sections 254.

In second mold half 234, overmolding is carried out on the second side of the pre-assemblies. In-parallel overmolding begins from flow at the location of secondary gates 224. Secondary gates 224 are created by portals in openings 14, as seen in FIG. 1, for all three isolated depressions called a leading second mold section 258, a middle second mold section 272, and a trailing second mold section 260, respectively. These portals are similar to secondary gate 24, seen in FIG. 2, that forms a portal in opening 14 also seen in FIG. 2. Upon entry of encapsulation material into second mold half 234, through secondary gate 224, overmolding proceeds by flow in a second flow direction 262 that may be opposite to flow in first flow direction 256.

It is understood that, prior to the injection of encapsulation material, first mold half 232 and second mold half 234 are mated by aligning first edges 264 and second edges 266 in a manner similar to what is depicted in FIG. 13 for first mold half 132 and second mold half 134.

A substrate is to be laid upon either first mold half 232 or upon second mold half 234 and the tooling 248 closed to form cavities similar to what is detailed in FIGS. 4 and 5. For tooling 248, the substrate is at least a 2×3 matrix, and preferably larger such as a 2×6, a 2 ×10, and a 2×12 or other two-by matrixes. The matrix may also be a three-by, such as a 3×3, a 3×6, a 3×9, a 3×12, and a 3×15 or other three-by matrixes.

Figure 15:
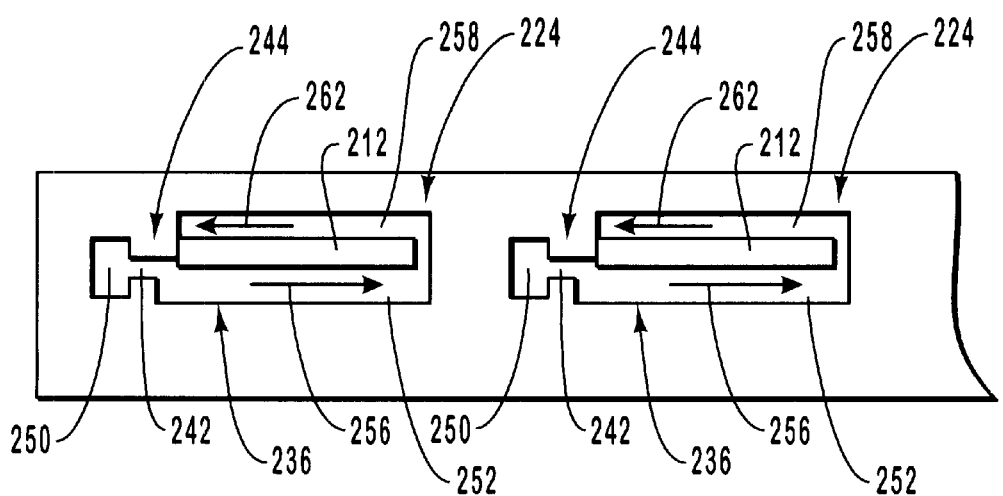
FIG. 15 is an elevational cross-section view of the multiple-part matrix overmold tooling depicted in FIG. 14 after mating the first mold half and the second mold half.

FIG. 15 is a cross-sectional view taken along the section lines 15—15 in FIG. 14 after mating of first mold half 232 and second mold half 234 of multiple-part matrix overmold tooling 248. Electrical devices 212 are enclosed within mold cavities 236. Mating is carried out by aligning first edges 264 and second edges 266 in a stacked relationship. The in-parallel asymmetrical flow of an encapsulation material is illustrated by viewing flow directions of the encapsulation material, beginning at headers 250 and along runners 242 toward primary gates 244, into leading first mold sections 252 and along first flow directions 256. Simultaneously, as seen in FIG. 14, encapsulation material also flows through headers 250, in the direction of middle first mold sections 270 and trailing first mold sections 254.

It is understood that flow within leading first mold sections 252 is the same as within middle first mold sections 270 and trailing first mold sections 254. When the flow of encapsulation material reaches secondary gates 224, it flows therethrough and into leading second mold sections 258. In leading second mold sections 258, the second flow directions 262 are reversed compared to first flow directions 256.

Figure 16:
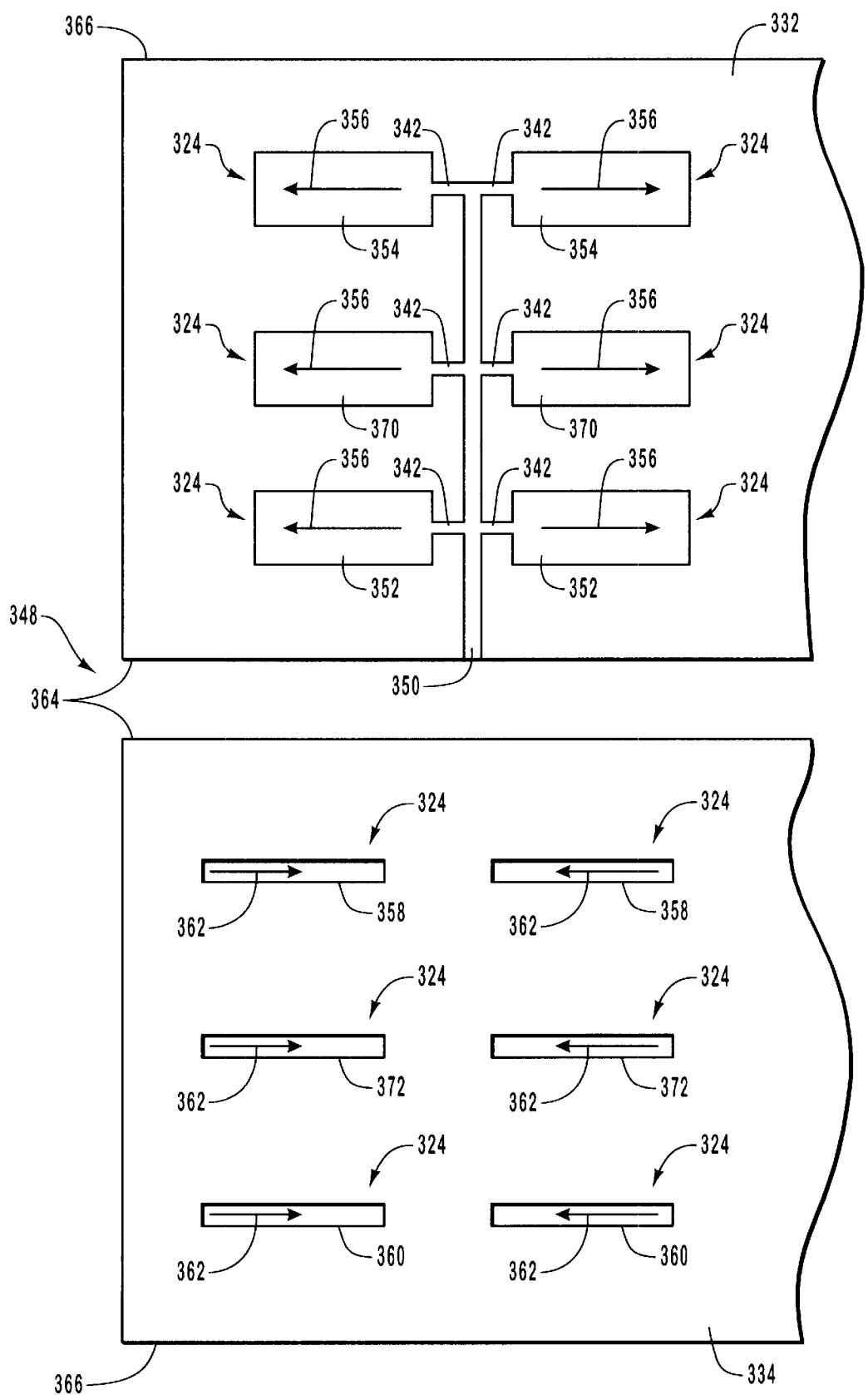
FIG. 16 is a plan view of a laid open multiple-part matrix overmold tooling according to another embodiment of the present invention.

FIG. 16 is a plan view of an inventive multiple-part matrix asymmetrical overmold tooling 348. Multiple-part asymmetrical overmold tooling 348 includes a first mold half 332 and a second mold half 334. First mold half 332 is illustrated in which a plurality of runners 342 are supplied from a header 350. A plunger (not pictured) or an equivalent positive displacement device supplies header 350. In FIG. 16, first mold halves 332 comprise an in-parallel double set of unisolated depressions called leading first mold sections 352, middle first mold sections 370, and trailing first mold sections 354. As such, asymmetrical overmolding is carried out on pre-assemblies in parallel between individual sets of leading first mold sections 352, middle first mold sections, 370, and trailing first mold sections 354. First flow directions 356 cause encapsulation material to flow from runners 342 in the directions away from header 350.

In second mold half 334, asymmetrical overmolding is carried out on the second side of the pre-assemblies. In-parallel overmolding begins from flow at the location of secondary gates 324. Secondary gates 324 are created by portals formed in openings 14, as seen in FIG. 1, for all three isolated depressions called leading second mold sections 358, middle second mold sections 372, and trailing second mold sections 360. These portals are similar to flow through the portal made by secondary gate 24, seen in FIG. 2, made from opening 14 also seen in FIG. 2. Upon entry of encapsulation material into second mold half 334, through secondary gates 324, overmolding proceeds by flow in second flow directions 362 that are opposite to first flow directions 356, and that flow back in the direction toward header 350.

It is understood that prior to the injection of encapsulation material, first mold section 332 and second mold section are mated in a manner similar to what is depicted in FIGS. 13 and 15. One of ordinary skill in the art may now appreciate other equivalents by which multiple-part matrix asymmetrical overmolding may be accomplished.

A substrate is to be laid upon either first mold half 332 or upon second mold half 334 and tooling 348 closed to form cavities (not shown). For tooling 348, the substrate is at least a 2×3 matrix, and preferably larger such as a 2×6, a 2×10, and a 2×12 or other two-by matrixes. The matrix may also be a three-by, such as a 3×3, a 3×6, a 3×10, and a 3×12 or other three-by matrixes.

Figure 17:
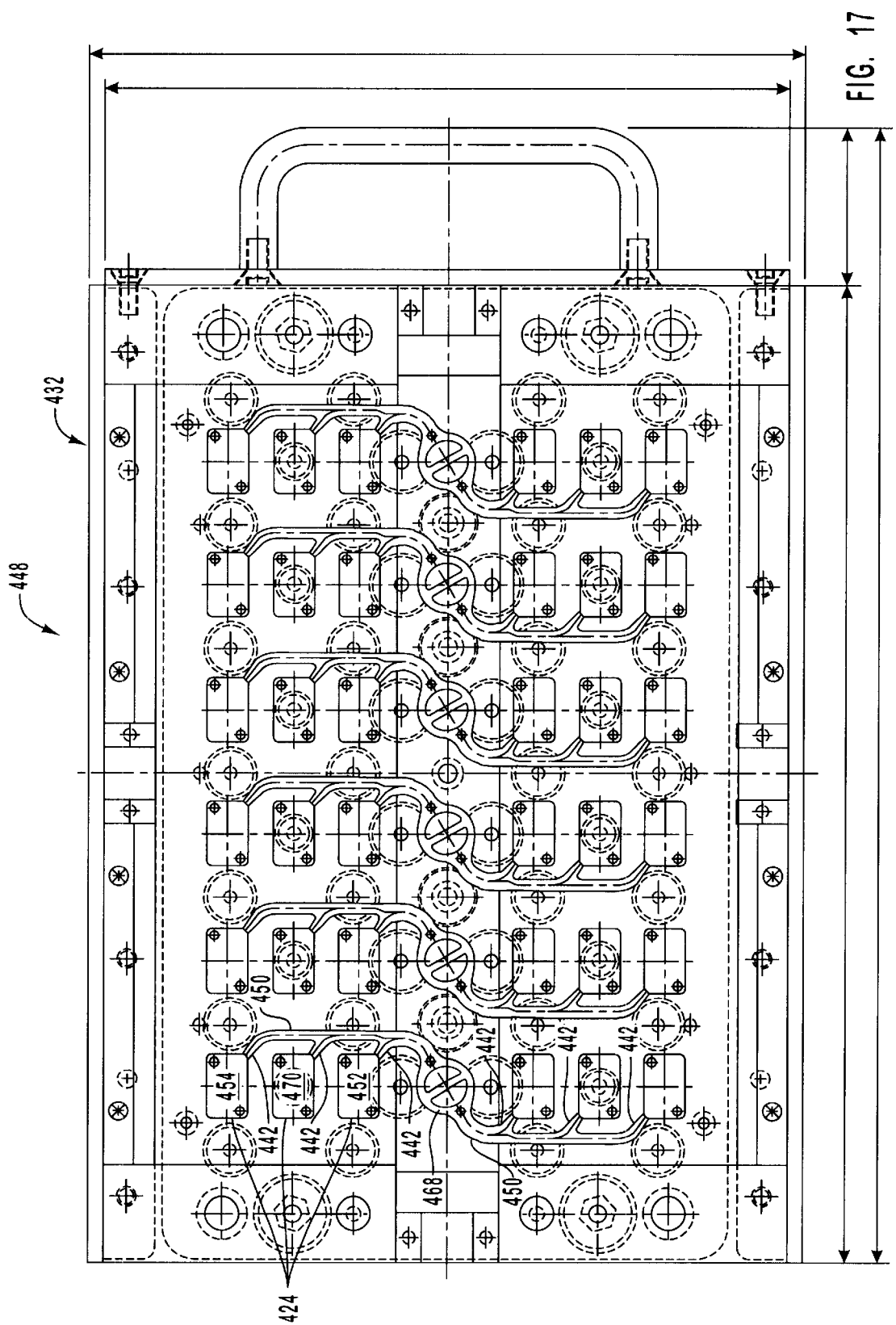
FIG. 17 is a plan view of a first mold half for a multiple-part matrix overmold tooling that illustrates another embodiment of the present invention.

FIG. 17 is a plan view of a first mold half 432 of an inventive multiple-part matrix asymmetrical overmold tooling 448. First mold half 432 is illustrated with a plurality of runners 442 that are supplied from headers 450. Plungers 468 or some equivalent positive displacement devices supply headers 450. In FIG. 17, first mold half 432 comprises two in-parallel sets of unisolated depressions called leading first mold sections 452, middle first mold sections 470, and trailing first mold sections 454. As such, overmolding is carried out on pre-assemblies in parallel between individual sets of leading first mold sections 452, middle first mold sections, 470, and trailing first mold sections 454. The first flow direction begins at runners 442 and flows in the directions away from headers 450.

As can now be appreciated, a second mold section (not pictured) mates with first mold section 432 in a manner similar to what has been previously described. For the embodiment of multiple-part matrix overmold tooling 448, the second mold section is similar to second mold section 334 seen in FIG. 15. Second flow directions 462 are caused by the placement of secondary gates 424.

Two substrates are to be laid upon either first mold half 432 or upon the second mold half (not pictured) and tooling 448 closed to form cavities (not pictured). For tooling 448, the substrates are two 3×6 matrixes. Additionally, a single 6×6 substrate may be laid upon tooling 448 after a manner that surrounds plungers 468. Other multiple-part matrixes may be formed depending upon the specific application.

In all the above embodiments disclosing asymmetrical molding of a plurality of chip and board pre-assemblies multiple-part matrixes, it has been demonstrated that a secondary gate provides flow of encapsulation material from the first-or chip side of an integrated circuit chip package pre-assembly, to the second-or ball side of the pre-assembly. As also set forth above, multiple-part matrix overmolding of the second-or ball side may be carried out with the alternative gate arrangement as set forth above.

It will be recalled that FIG. 11 shows the alternative gate arrangement that may be used with the present invention, also in asymmetrical molding of multiple-part matrixes. The devices are positioned such that the secondary gates (see FIGS. 12–17) are completely blocked. Thus, encapsulation material injected into that part of the mold cavity that is the first mold half from a runner and a primary gate, is contained within the first mold half and cannot flow into the second mold half. That is, there is no portal to form a secondary gate between the first mold half and the second mold half through which encapsulation material may flow. Encapsulation material may be injected directly into the second mold half through a second side primary gate from a runner. The encapsulation material injected into the second mold half is contained within the second mold half. Preferably to accomplish the sealing relationship on the side with the smaller surface area to be asymmetrically overmolded, the first mold half is filled first.

The method of forming an assembly may be better understood by viewing the cross-sections of FIGS. 5 and 5A in connection with the multiple-part matrix overmold toolings depicted herein as items 148, 248, 348, and 448. The inventive method comprises forming at least one substrate 10 having a plurality of package sites, wherein each package site has a first or chip side surface 16 and a second or ball side surface 20. A plurality of electrical devices 12 is attached to at least some of the plurality of package sites located on substrate 10 to form a plurality of device and substrate pre-assemblies. A first amount of an encapsulation material is positioned on each first surface 16 and subsequently, a second amount of encapsulation material is positioned on each second surface 20. The second surface has a smaller surface area that usually results in a smaller amount of encapsulation material positioned on second surface 20 in comparison to first surface 16. In any case, first mold half projected surface area 84 is larger than second mold half projected surface area 86.

The present invention may be carried out both for chip-on-board and board-on-chip technology as seen in FIG. 5 and 5A respectively. Because of the multiple-part matrix asymmetrical molding nature of the present invention, positioning a first amount of encapsulation material upon first surface 16 precedes positioning a second amount of encapsulation material in order to achieve a sealing relationship between second surface 20 of substrate 10 and second mold section 34.

The inventive method may also be described as a method of forming an assembly that includes providing a plurality of semiconductor chip and printed circuit board pre-assemblies that as assembled, have a first surface 16 and a second surface 20. The inventive method comprises simultaneously encapsulating the plurality of semiconductor chips and printed circuit board pre-assemblies by transfer molding, wherein each pre-assembly is primary overmolded on the primary and larger surfaces 16 and secondary overmolded through secondary gates 24 on the secondary surfaces 20.

The longitudinal axis of electrical device 12 may also be described by the directions indicated by both first flow direction such as 56 and second flow direction such as 62 seen in FIG. 6. As such, the present invention comprises injecting encapsulation material through a plurality of primary gates such as primary gate 44 to flow in the direction of longitudinal axis 56 of each chip inactive surface 82. Further, encapsulation material is directed through a plurality of secondary gates such as secondary gate 24 to flow along the longitudinal axis of each chip active surface 80 in second flow direction 62 that is opposite to first flow direction 56.

FIGS. 12–17 illustrate multiple-part matrix encapsulation toolings, referred herein as tooling 148 seen by way of non-limiting example in FIG. 12. First mold half 132 includes a plurality of unisolated depressions or mold sections 152, 154 disposed therein. Each depression is in flow communication with at least one other depression through either runner channel 142, 153 or header channel 150. Tooling 148 further comprises second mold half 134 that has a plurality of isolated depressions or mold sections 158, 160 that equal a first mold half plurality of depressions or mold sections 152, 154. Each second half mold depression is of equal surface area projected onto second surfaces 20 (see FIG. 5), and each second mold half depression is smaller in projected surface area than its corresponding first mold half depression.

FIG. 12 illustrates that first unisolated depression 152 is in flow communication with a header channel 150 and a runner channel 142 on one edge thereof and with a runner channel 153 on a second edge thereof. FIGS. 14 and 16 illustrate multiple-part matrix asymmetrical encapsulation toolings 248, 348 wherein multiple header channels 250 or a single header channel 350 is in flow communication with at least three first unisolated depressions 252, 270, 254, or 352, 370, 354, respectively. FIG. 16 illustrates a tooling 348, wherein header channel 350 supplies a plurality of unisolated depressions such as mold sections 352, 370, 354 that are disposed on opposite sides of header channel 350.

FIGS. 14–17 illustrate multiple-part matrix encapsulation toolings that include a plurality of n first unisolated depressions located in a first mold half such as first mold half 232 wherein the plurality of n first depressions, by way of example first mold sections, is connected in parallel from at least one header channel such as header channel 250 by n runner channels 242. It also includes a plurality of n first isolated depressions, by way of example second mold sections, located in second mold half 234 wherein the plurality of n first isolated depressions is smaller in projected surface area than that of the plurality of n first depressions located in first mold half 232. FIG. 16 illustrates that header channel 350 has unisolated depressions arranged in bilateral symmetry thereto.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of forming a chip package comprising:
    forming at least one substrate having a plurality of chip sites, each chip site having a first side and a second side;
    attaching a plurality of n electrical devices to at least some of the plurality of the chip sites to form a plurality of n pre-assemblies, each pre-assembly having a first surface and a second surface;
    positioning a first amount of encapsulation material on each first surface; and
    positioning a second amount of encapsulation material, of smaller surface area than that of the first amount, on each second surface.

2. The method as defined in claim 1, wherein positioning a first amount of encapsulation material and positioning a second amount of encapsulation material is performed by transfer molding.

3. The method as defined in claim 1, wherein each electrical device has both an active surface and an inactive surface, and wherein each active surface is disposed against a corresponding chip site first side.

4. A method of forming a chip package comprising:
    forming at least one substrate having a plurality of chip sites, each chip site having a first side and a second side;
    attaching a plurality of n electrical devices to at least some of the plurality of the chip sites to form a plurality of n pre-assemblies, each pre-assembly having a first surface and a second surface;
    positioning a first amount of encapsulation material on each first surface;
    positioning a second amount of encapsulation material, of smaller surface area than that of the first amount, on each second surface;
    positioning the plurality of pre-assemblies into a first mold half; and
    forming a plurality of mold cavities with the first mold half and a second mold half, wherein positioning a first amount of encapsulation material and positioning a second amount of encapsulation material is done by transfer molding.

5. The method as defined in claim 4, wherein positioning the plurality of n pre-assemblies into a first mold half results in the plurality of n electrical devices being situated within the first mold half.

6. The method as defined in claim 4, wherein forming a plurality of mold cavities with the first mold half and a second mold half results in the creation of a plurality of flow paths between each part of the mold cavities defined by the first mold half and each part of the mold cavities defined by the second mold half.

7. The method as defined in claim 4, wherein positioning a first amount of encapsulation material on each first surface by transfer molding results in a seal against encapsulation material between each second surface and the second mold half.

8. The method as defined in claim 4, further comprising:
    applying external force to the second mold half to form a seal against encapsulation material between each second surface and the second mold half.

9. The method as defined in claim 4, wherein foiling a plurality of mold cavities with the first mold half and the second mold half results in electrical leads and connections to electrical leads within the second mold half.

10. The method as defined in claim 4, wherein the first mold half further comprises:
    a plurality of leading first mold sections and a corresponding plurality of trailing first mold sections, each leading first mold section and the trailing first mold section being in flow communication by a runner disposed therebetween, wherein positioning a first amount of encapsulation material precedes positioning a second amount of encapsulation material.

11. The method as defined in claim 10, wherein the second mold half further comprises:
    a plurality of leading second mold sections and a corresponding plurality of trailing second mold sections, each leading second mold section being in flow communication with the leading first mold section, and the trailing second mold section being in flow communication with the trailing first mold section, wherein positioning a first amount of encapsulation material precedes positioning a second amount of encapsulation material.

12. A method of forming an assembly comprising:
    providing a plurality of chip and printed circuit board pre-assemblies, the chip and printed circuit board pre-assemblies having a first surface and a second surface and wherein each chip has an active surface and an inactive surface; and simultaneously encapsulating the plurality of chip and printed circuit board pre-assemblies by transfer molding, wherein each chip and printed circuit board pre-assembly is overmolded on the first surface and then is overmolded on the second surface.

13. The method as defined in claim 12, wherein the first surface has a larger surface area encapsulated than that of the second surface.

14. The method as defined in claim 12, wherein the first surface is chip overmolded and wherein the second surface is bond wire overmolded.

15. The method as defined in claim 12, wherein simultaneously encapsulating the plurality of chip and printed circuit board pre-assemblies by transfer molding further comprises:

injecting encapsulation material through a plurality of primary gates to flow along the longitudinal axis of each chip inactive surface in a first direction; and directing the encapsulation material through a plurality of secondary gates to flow along the longitudinal axis of each chip active surface in a second direction that is opposite to the first direction.

16. The method as defined in claim 12, wherein the plurality of chip and printed circuit board pre-assemblies are arrayed as a plurality of in a series pre-assemblies within a multiple-part matrix.

17. The method as defined in claim 12, wherein the plurality of chip and printed circuit board pre-assemblies are arrayed in parallel and wherein simultaneously encapsulating includes flow of encapsulation material in a single direction from a header channel.

18. The method as defined in claim 12, wherein the plurality of chip and printed circuit board pre-assemblies are arrayed in parallel and wherein simultaneously encapsulating includes flow of encapsulation material in two opposite directions away from a header channel.

19. The method as defined in claim 12, wherein the plurality of chip and printed circuit board pre-assemblies are allayed as a matrix selected from the group of a 2×6, a 2×10, and a 2×12.

20. The method as defined in claim 12, wherein the plurality of chip and printed circuit board pre-assemblies are arrayed as a matrix selected from the group of a 3×3, a 3×6, a 3×9, a 3×12, and a 3×15.

21. A method of forming a chip package assembly comprising:

providing a plurality of chip and printed circuit board pre-assemblies having a first surface and a second surface;

positioning a first molding section having a first plurality of pre-assembly molding sites in a sealing relationship with each said first surface;

positioning a second molding section having a second plurality of pre-assembly molding sites against each said second surface, wherein each chip of each said chip and printed circuit board pre-assembly has an active surface and an inactive surface; and simultaneously encapsulating the plurality of chip and printed circuit board pre-assemblies by transfer molding, wherein each said chip and printed circuit board pre-assembly is overmolded on the first surface and then is overmolded on the second surface.

22. The method as defined in claim 21, wherein the first plurality of pre-assembly mold sites have larger cavity volumes than that of the second plurality of pre-assembly mold sites.

23. The method as defined in claim 21, wherein encapsulating the plurality of chip and printed circuit board pre-assemblies by transfer molding further comprises:

overmolding on each first surface under conditions to seal the second molding section against each second surface.

* * * * *